United States Patent
Roy et al.

(10) Patent No.: US 11,776,840 B2
(45) Date of Patent: Oct. 3, 2023

(54) SUPERSTRATE CHUCK, METHOD OF USE, AND METHOD OF MANUFACTURING AN ARTICLE

(71) Applicant: CANON KABUSHIKI KAISHA, Tokyo (JP)

(72) Inventors: Nilabh K. Roy, Austin, TX (US); Mario Johannes Meissl, Austin, TX (US); Seth J. Bamesberger, Austin, TX (US); Ozkan Ozturk, Round Rock, TX (US); Byung-Jin Choi, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 858 days.

(21) Appl. No.: 16/667,213

(22) Filed: Oct. 29, 2019

(65) Prior Publication Data

US 2021/0125855 A1    Apr. 29, 2021

(51) Int. Cl.
*H01L 21/687* (2006.01)
*B29C 33/00* (2006.01)
*B29C 35/08* (2006.01)

(52) U.S. Cl.
CPC ........ *H01L 21/68785* (2013.01); *B29C 33/00* (2013.01); *B29C 35/0805* (2013.01); *B29C 2033/0005* (2013.01); *B29C 2035/0827* (2013.01); *B29K 2995/0026* (2013.01)

(58) Field of Classification Search
CPC .............. H01L 21/68785; B29C 33/00; B29C 35/0805; B29C 2033/0005; B29C 2035/0827; B29K 2995/0026; B25B 11/005; G03F 7/707; G03F 7/0002
See application file for complete search history.

(56) References Cited

U.S. PATENT DOCUMENTS

| 6,032,997 | A | * | 3/2000 | Elliott | B25B 11/005 |
| | | | | | 269/21 |
| 6,873,087 | B1 | * | 3/2005 | Choi | G03F 7/0002 |
| | | | | | 310/323.17 |
| 9,205,528 | B2 | | 12/2015 | Dkafuji et al. | |

(Continued)

FOREIGN PATENT DOCUMENTS

| JP | 2006309143 A | 11/2006 |
| TW | 201024076 A | 7/2010 |

(Continued)

OTHER PUBLICATIONS

Lee, "A First Review of Optical Edge-Diffraction Technology for Precision Dimensional Metrology," The International Journal of Advanced Manufacturing Technology (2019) 102, pp. 2465-2480; published online: Feb. 1, 2019 (Year: 2019).*

(Continued)

*Primary Examiner* — Leith S Shafi
*Assistant Examiner* — Inja Song
(74) *Attorney, Agent, or Firm* — Canon U.S.A., Inc., IP Division

(57) ABSTRACT

A chuck for retaining a superstrate or a template. The chuck comprises a geometric structure formed on a surface of the chuck. The geometric structure includes at least one of a rounded edge portion and a roughened surface portion, such that an intensity variation of light transmitting through the geometric structure and an area of the chuck adjacent to the geometric structure is reduced.

13 Claims, 5 Drawing Sheets

(56) References Cited

U.S. PATENT DOCUMENTS

| | | | |
|---|---|---|---|
| 9,829,384 B2 | 11/2017 | Pezzaniti et al. | |
| 2005/0056963 A1* | 3/2005 | McCutcheon | H01L 21/6719 264/316 |
| 2009/0179365 A1* | 7/2009 | Lerner | B25B 11/005 269/21 |
| 2012/0103937 A1 | 5/2012 | Haneda | |
| 2015/0091230 A1* | 4/2015 | GanapathiSubramanian | G03F 7/0002 269/21 |
| 2019/0080922 A1 | 3/2019 | Khusnatdinov | |
| 2019/0339550 A1* | 11/2019 | Grundmann | G02F 1/01725 |
| 2021/0074574 A1* | 3/2021 | Ji | H01L 21/68735 |

FOREIGN PATENT DOCUMENTS

| | | | |
|---|---|---|---|
| TW | 201308019 A | 2/2013 | |
| TW | 201527871 A | 7/2015 | |
| WO | WO-2017209051 A1 * | 12/2017 | G03F 7/20 |

OTHER PUBLICATIONS

English translation of WO-2017209051-A1 by EPO (OA Appendix). (Year: 2017).*

Wang, J., Zhang, W. Cui, Y. Tseng, S.; "Fresnel Diffraction by a Square Aperture with Rough Edge;" Optik 126(21), 3066-3071; (2015).

Davis, Bradley A., Gary S. Brown; "Diffraction by a Randomly Rough Knife Edge;" IEEE Transactions on Antennas and Propagation 50.12 (2002): 1769-1778; Dec. 2002.

ChaBum Lee; "A First Review of Optical Edge-Diffraction Technology for Precision Dimensional Metrology" The International Journal of Advanced Manufacturing Technology, 1-16; Jan. 14, 2019.

Cui, Y., Zhang M., Teng, S.; "Fresnel Diffraction of Aperture With Rough Edge;" Journal of Optics, 17(6), 065607; (2015).

Lee, C., Mahajan, S. M., Zhao R., Jeon, S.; "A Curved Edge Diffraction-Utilized Displacement Sensor for Spindle Metrology;" Review of Scientific Instruments, 87(7), 075113; (2016).

* cited by examiner

SUPERSTRATE CHUCK, METHOD OF USE, AND METHOD OF MANUFACTURING AN ARTICLE

BACKGROUND

Field of Art

The present disclosure relates to substrate processing, and more particularly, to the planarization of surfaces in semiconductor fabrication.

Description of the Related Art

Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

SUMMARY

A light transmitting chuck for retaining a superstrate or a template is provided. The chuck comprises a geometric structure formed on a surface of the chuck. The geometric structure includes at least one of a rounded edge portion and a roughened surface portion, such that an intensity variation of light transmitting through the geometric structure and an area of the chuck adjacent to the geometric structure is reduced. The geometric structure may include a parallel surface portion parallel with the surface of the chuck and the roughened surface extending from the surface of the chuck to the parallel surface. The roughened edge portion may include a first roughened edge around the parallel surface portion and a second roughened edge around the surface of the chuck.

The geometric structure may comprise a plurality of lands extending from the surface to define a plurality of zones of the chuck, at least a channel recessed from the surface of the chuck, at least a port extending through the chuck, or a combination of these structures. The surface of the chuck is preferably a support surface of the superstrate or the template.

A method is provided. In the method, a superstrate or a template is retained with a light transmitting chuck comprising a geometric structure. The geometric structure includes at least one of a rounded edge portion and a roughened surface portion. The superstrate or template is advanced to be in contact with a formable material dispensed on a substrate. The superstrate or the template is then released from the chuck, and a curing process is performed on the formable material by radiating light through the chuck and the superstrate or the template. The rounded corner and the roughened surface allows an intensity variation of the light transmitting through the geometric structure and an area of the chuck adjacent to the geometric structure to be reduced. Preferably but optionally, the light for curing the formable material includes UV light.

A method of manufacturing an article is also provided. To manufacture the article, a formable material is dispensed on a substrate, a superstrate retained with a light transmitting chuck is advanced in contact with the formable material. The chuck comprises a geometric structure that comprises at least one of a rounded edge portion and a roughened surface portion. The superstrate is then released from the chuck, followed by radiating light through the chuck and the superstrate or the template to cure the formable material. An intensity variation of the light transmitting through the geometric structure and an area of the chuck adjacent to the geometric structure is reduced by at least one of the rounded corner and the roughened surface.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Figure 1:
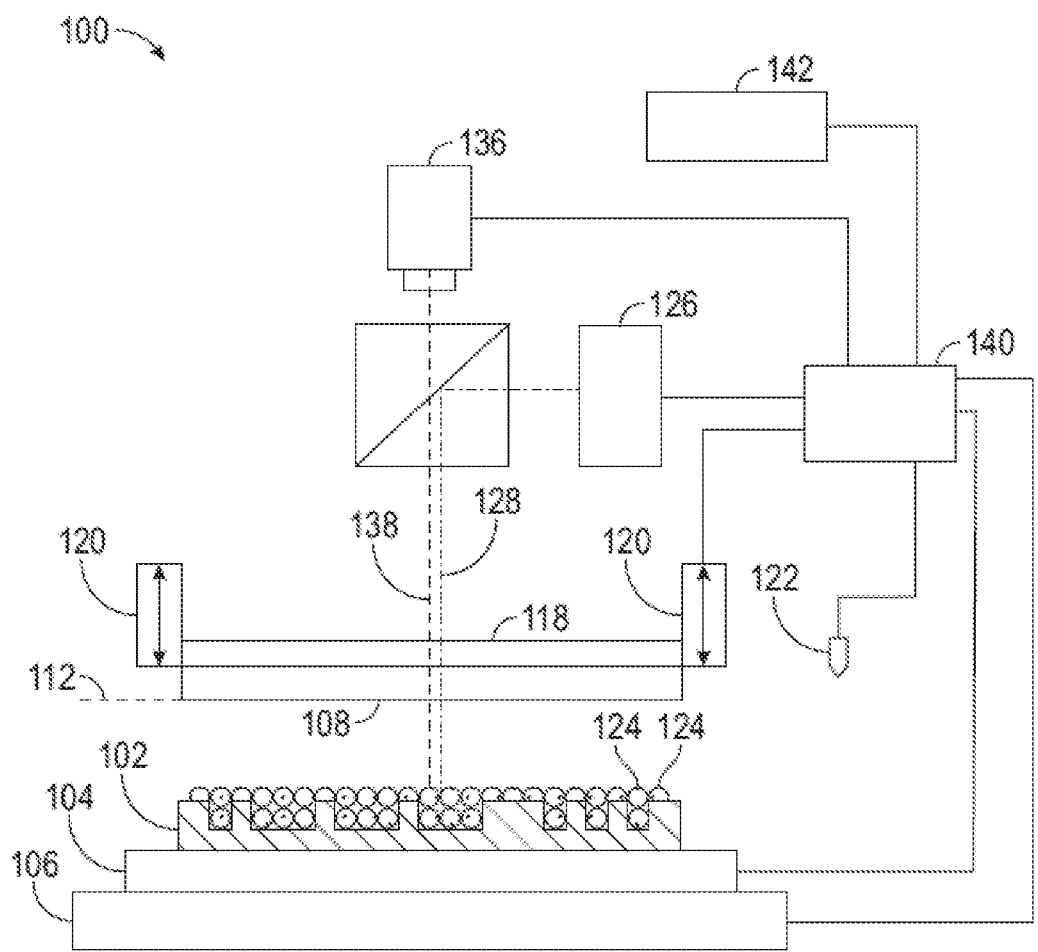
FIG. 1 is a diagram illustrating an apparatus that can be used for planarization.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

FIG. 1 illustrates an apparatus 100 that, among other things, can be used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ-, and φ-axes. The substrate positioning stage 106, the substrate 102, and the substrate chuck 104 may also be positioned on a base (not shown). The substrate positioning stage may be a part of a positioning system.

Spaced apart from the substrate 102 is a superstrate 108 having a working surface 112 facing substrate 102. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. Surface 112 is generally of the same areal size or slightly smaller as the surface of the substrate 108. Surface 112 of superstrate 108 can include a planar contact surface. In another embodiment, the contact surface can include features that define any original pattern that forms the basis of a pattern to be formed on the substrate 102.

Superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck is likewise readily transparent to UV light. The superstrate chuck 118 may include a system such as a zone based vacuum chuck, an actuator array, a pressure bladder, etc., which can apply a pressure differential to a back surface of the superstrate 108 to cause the template to bend and deform. In one embodiment, the superstrate chuck 118 includes a zone based vacuum chuck which can apply a pressure differential to a back surface of the superstrate, causing the superstrate to bend and deform as further detailed herein.

The superstrate chuck 118 may be coupled to a head 120 which is a part of the positioning system. The head 120 may be movably coupled to a bridge. The head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis).

The apparatus 100 may further comprise a fluid dispenser 122. The fluid dispenser 122 may also be movably coupled to the bridge. In an embodiment, the fluid dispenser 122 and the head 120 share one or more of all positioning components. In an alternative embodiment, the fluid dispenser 122 and the head 120 move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The apparatus 100 may further comprise a curing system that includes a radiation source 126 that directs actinic energy, for example, UV radiation, along an exposure path 128. The head 120 and the substrate positioning state 106 may be configured to position the superstrate 108 and the substrate 102 in superimposition with the exposure path 128. The radiation source 126 sends the actinic energy along the exposure path 128 after the superstrate 108 has contacted the formable material 128. FIG. 1 illustrates the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The apparatus 100 may further comprise a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

The apparatus 100 may be regulated, controlled, and/or directed by one or more processors 140 (controller) in communication with one or more components and/or subsystems such as the substrate chuck 104, the substrate positioning stage 106, the superstrate chuck 118, the head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, the head 120, the substrate position stage 106, or both vary a distance between the superstrate 118 and the substrate 102 to define a desired space (a bounded physical extent in three dimensions) that is filled with the formable material 124. For example, the head 120 may be moved toward the substrate and apply a force to the superstrate 108 such that the superstrate contacts and spreads droplets of the formable material 124 as further detailed herein.

Planarization Process

Figure 2A:
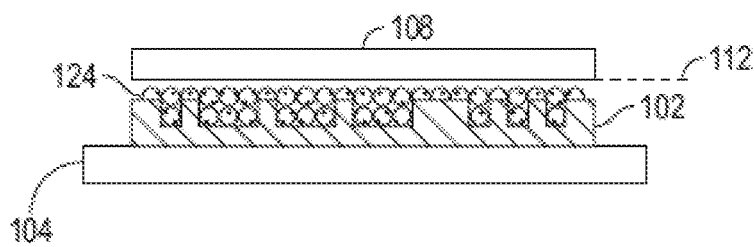
FIGS. 2a to 2c illustrate a planarization process.
Figure 2B:
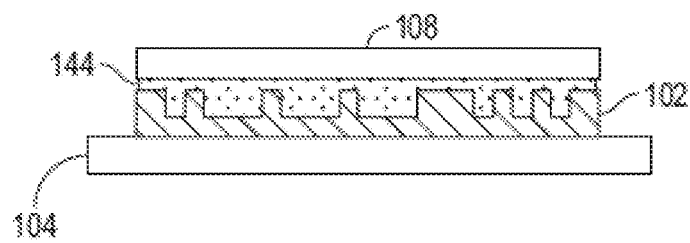
Figure 2C:
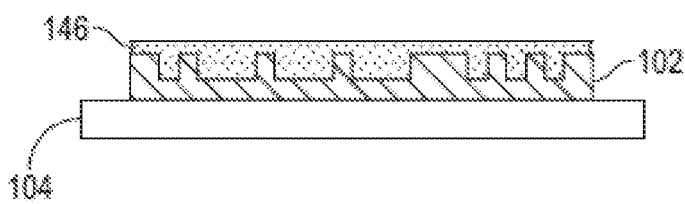

The planarization process includes steps which are shown schematically in FIGS. 2a-2c. As illustrated in FIG. 2a, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The superstrate 108 is then positioned in contact with the formable material 124.

FIG. 2b illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 2c illustrates the cured planarized layer 146 on the substrate 102 after separation of the superstrate 108. The substrate and the cured layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate may be processed to produce a plurality of articles (devices).

Curing Planarization Material Between Superstrate and Substrate

Figure 3:
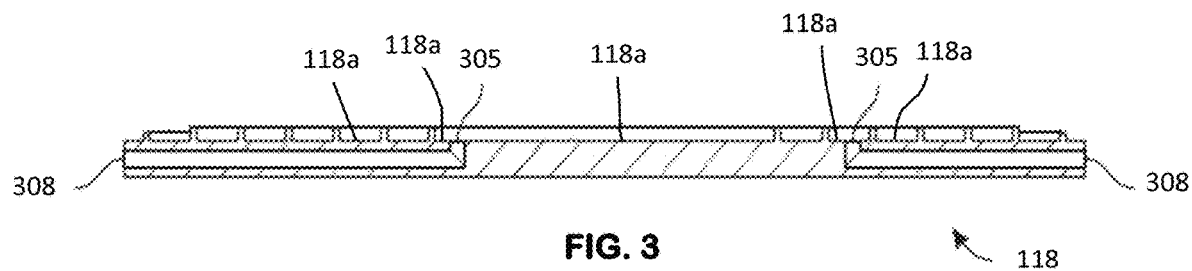
FIG. 3 illustrates a multi-zone superstrate chuck in one embodiment.

As shown in FIG. 3, a light transmitting chuck, particularly a superstrate chuck 118 or a chuck 118 for retaining a template, may comprise a plurality of geometric structures such as a port 305, a series of lands 307, and a plurality of channels 308, that are integrated into the chuck body. However, during curing of the formable material, these geometric features may cause localized non-uniform transmissivity of the curing light transmitting through the chuck. The non-uniform light transmissivity can result in uneven curing rates and material shrinkage during curing, and affect the quality of the planarization layer for etching and other subsequent processes. The non-uniform transmissivity caused by these geometric structures is further detailed below with respect to channels or lands as exemplary geometric features.

Figure 4A:
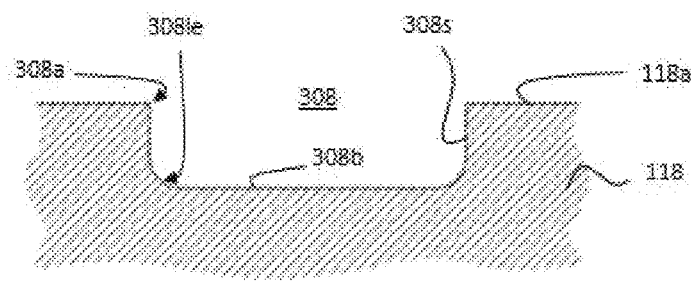
FIGS. 4a to 4b show geometric structures of a superstrate chuck.
Figure 4B:
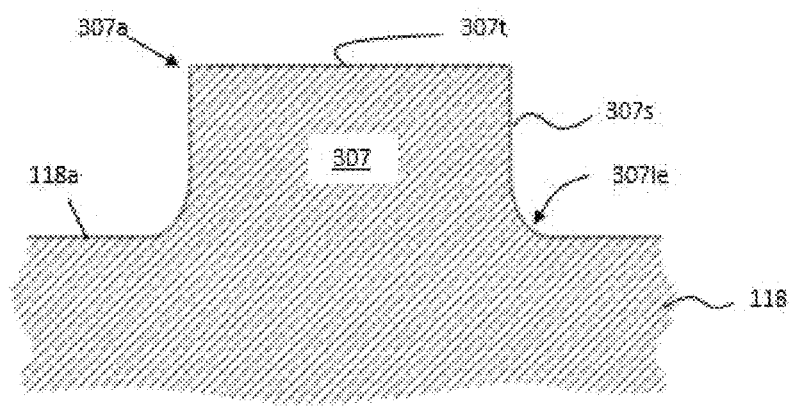

FIG. 4a shows a cross section of a channel 308 that includes a bottom surface 308b parallel with the surface 118a of the superstrate chuck 118. The channel 308 also includes a smooth sidewall 308s extending between the bottom surface 308b and the surface 118a of the chuck 118. The channel 308 also includes a pair of sharp upper corners or edges 308a at the surface 118a of the chuck 118 and a pair of rounded lower corners 308le at the bottom surface 308b. FIG. 4b shows a cross section of a land 307 formed on the superstrate chuck 118. The land 307 similarly includes a top surface 307t parallel with the chuck surface 118a and a smooth sidewall 307s extending between the top surface 307t and the surface 118a of the superstrate chuck, and likewise having a pair of sharp upper corners or edges 307a at the top surface 307t and pair of rounded lower corners 307le at the surface 118a of the chuck 118. It was observed that the intensity of light transmitting through the chuck 118 at the channel 308 and the areas adjacent to the channel has two intensity spikes at the sharp edges and two low intensity zones immediately adjacent to the sidewall 308s of the channel 308.

The intensity spikes at the sharp edges 308a of channel are similar to the intensity distributions attributable to Fresnel diffraction at a straight edge. Further, when light radiates through the channel 308, the rounded corner 308le between the sidewall 308s and the bottom surface of the channel 308 acts as a lens and redistributes the incident light. The redistribution of the light by the lens effect causes a large area of low transmissivity or low intensity. The combination of the Fresnel diffraction and the lens effects results in large localized spatial gradients in the light intensity reaching the formable material during curing. This non-uniform light transmission adversely affects curing of the formable material and further affects the quality of the formed planarized layer.

Figure 5A:
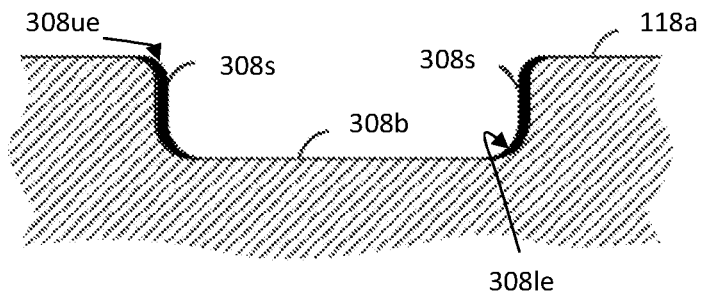
FIGS. 5a to 5b show geometric structures of a superstrate chuck according to one embodiment.

FIG. 5a shows a cross section of a channel 308 with a structure that minimizes the diffraction effect and the lens effect, so as to improve the uniformity of transmissivity of the light transmitting through the chuck. As shown, the channel 308 includes a bottom surface 308b parallel with the surface 118a of the superstrate chuck 118. The channel 308 also includes a sidewall 308s extending between the bottom surface 308b and the surface 118a of the chuck 118. To reduce the diffraction effects caused by the sharp edges, both the upper edge 308ue between the chuck surface 118a and the sidewall 308s and the lower edge 308le between the bottom surface 308b and the sidewall 308s are rounded or chamfered. In one embodiment, the radius of curvature of the rounded edges 308ue and 308le ranges approximately between 0.05 mm and 1 mm. To minimize the lens effects, the sidewall 308s is roughened with a coarse surface that diffuses the light incident thereon. Preferably but optionally, the roughness of the sidewall ranges approximately between 100 nm and 1 μm. It is appreciated that the ranges of the roundness of the edges 308ue and 308le and the roughness of the sidewall 308s may vary depending on the actual dimensions of the channel 308 and the characteristics of the light transmitting through the superstrate chuck 118.

Figure 5B:
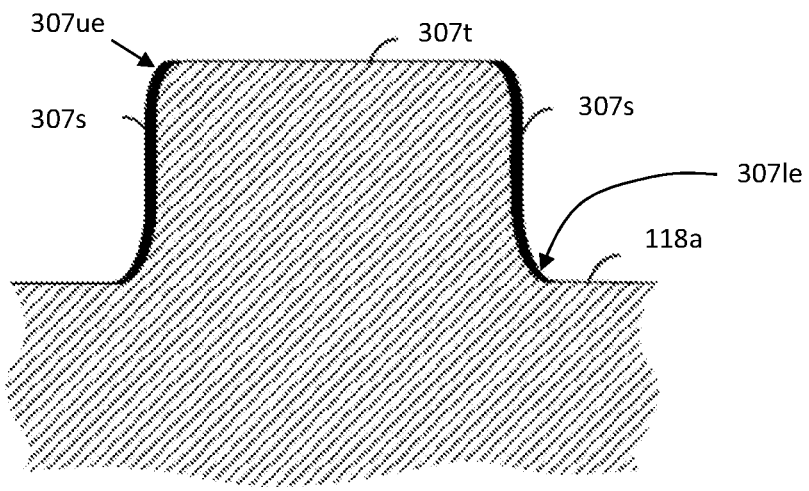

FIG. 5b shows a cross section of a land 307 formed on the superstrate chuck 118. The land 307 includes a top surface 307t parallel with the chuck surface 118a and a sidewall 307s extending between the top surface 307t and the surface 118a of the superstrate chuck 118. Similar to the channel 308, the upper edge 307ue between the top surface 307t and the sidewall 307s and the lower edge 307le are rounded with a radius of curvature preferably between 0.05 mm and 1 mm. The sidewall 307s is roughened into a coarse surface with a roughness between about 100 nm and about 1 µm. The actual dimensions of the rounded edges and the roughened sidewall depend on the dimension of the land 307 and the characteristic of the transmitting light.

Figure 6:
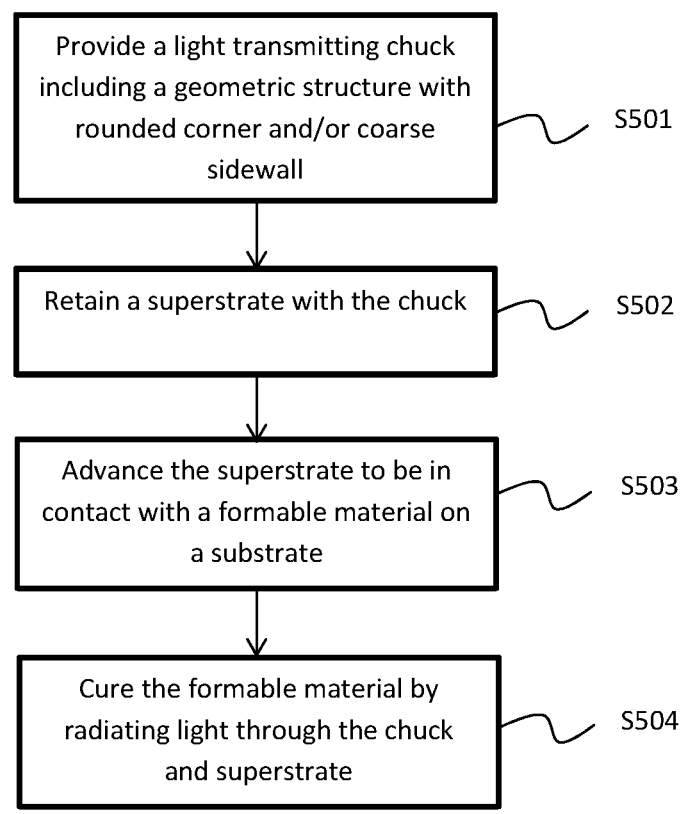
FIG. 6 is a process flow of a method using a superstrate chuck having the structure as shown in FIGS. 5a and/or 5b.

A chuck with the structure as shown in FIG. 5a or 5b can be used in a method with the steps as illustrated in flow chart of FIG. 6. In step S501, a light transmitting chuck including a geometric structure is provided. The geometric structure includes at least a rounded edge portion, a roughened surface, or both the rounded edge portion and the roughened surface. A superstrate or a template is retained with the chuck in step S502. In step S503, the superstrate or the template is advanced to be in contact with a formable material dispensed on a substrate, such that the front of the formable material can be advanced from the center to the perimeter of the substrate. The formable material is then cured by radiating light through the chuck and the superstrate or the template in step S904. With the rounded corner and/or the coarse sidewall of the geometric feature, the intensity variation of the light transmitting through the geometric structure and an area adjacent to the geometric structure is effectively reduced.

The chuck having structures of FIGS. 5a and 5b can also be used in manufacturing an article. For example, a formable material can be dispensed on a substrate. A superstrate is retained with a light transmitting chuck that includes a geometric structure. The geometric structure comprises at least one of a rounded edge portion and a roughened surface portion. The superstrate is advanced to be in contact with the formable material dispensed on a substrate, such that the front of the formable material can be advanced from the center to the perimeter of the substrate. The superstrate is then optionally released from the chuck, the formable material is cured by radiating light through the chuck. An intensity variation of the light transmitting through the geometric structure and an area of the chuck adjacent to the geometric structure is reduced by at least one of the rounded corners and the roughened surface.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A light transmitting chuck for retaining a superstrate or a template, the chuck comprising:
    a chuck surface;
    a channel recessed from the chuck surface, the channel including:
        a channel surface parallel to the chuck surface;
        a channel sidewall extending from the chuck surface to the channel surface;
        a rounded edge between the chuck surface and the channel sidewall,
        wherein the chuck surface transitions to the channel sidewall via the rounded edge of the channel; and
    a land extending from the chuck surface, the land including:
        a land surface parallel to the chuck surface;
        a land sidewall extending from the land surface to the chuck surface; and
        a rounded edge between the land surface and the sidewall,
        wherein the land surface transitions to the land sidewall via the rounded edge of the land, and
    wherein an intensity variation of light transmitting through the land and an area of the chuck adjacent to the land is reduced by the rounded edge of the land.

2. The chuck of claim 1, wherein the land includes a roughened portion.

3. The chuck of claim 2, wherein the roughened portion includes a first roughened edge around the land surface and a second roughened edge around the chuck surface.

4. The chuck of claim 1, further comprising a plurality of other lands extending from the chuck surface, wherein the land and the plurality of other lands define a plurality of zones.

5. The chuck of claim 1, further comprising at least a port extending through the chuck.

6. The chuck of claim 1, wherein the chuck surface is a support surface of the superstrate or the template.

7. A method, comprising:
    retaining a superstrate or a template with a light transmitting chuck, the chuck including:
        a chuck surface;
        a channel recessed from the chuck surface, the channel including:
            a channel surface parallel to the chuck surface;
            a channel sidewall extending from the chuck surface to the channel surface; and
            a rounded edge between the chuck surface and the channel sidewall,
            wherein the chuck surface transitions to the channel sidewall via the rounded edge of the channel; and
        a land extending from the chuck surface, the land including:
            a land surface parallel to the chuck surface;
            a land sidewall extending from the land surface to the chuck surface; and
            a rounded edge between the land surface and the land sidewall,
            wherein the land surface transitions to the land sidewall via the rounded edge of the land;
    advancing the superstrate or the template to be in contact with a formable material dispensed on a substrate;
    releasing the superstrate or the template from the chuck; and
    radiating light through the chuck and the superstrate or the template to cure the formable material, wherein an intensity variation of the light transmitting through the land and an area of the chuck adjacent to the land is reduced by the rounded edge of the land.

8. The method of claim 7, wherein the light includes UV light.

9. The method of claim 7, wherein the land includes a roughened portion.

10. The method of claim 9, wherein the roughened portion includes a first roughened edge around the land surface and a second roughened edge around the chuck surface.

11. The method of claim 7, wherein the chuck includes a plurality of other lands extending from the chuck surface.

12. The method of claim 7, wherein the chuck includes a port extending through the chuck.

13. A method of manufacturing an article, comprising:
    dispensing a formable material on a substrate;
    retaining a superstrate with a light transmitting chuck, the chuck including:
        a chuck surface;

a channel recessed from the chuck surface, the channel including:
    a channel surface parallel to the chuck surface;
    a channel sidewall extending from the chuck surface to the channel surface;
    a rounded edge between the chuck surface and the channel sidewall,
    wherein the chuck surface transitions to the channel sidewall via the rounded edge of the channel; and
a land extending from the chuck surface, the land including:
    a land surface parallel to the chuck surface;
    a land sidewall extending from the land surface to the chuck surface; and
    a rounded edge between the land surface and the land sidewall,
wherein the land surface transitions to the land sidewall via the rounded edge of the land;
advancing the superstrate to be in contact with the formable material dispensed on the substrate;
releasing the superstrate from the chuck; and
radiating light through the chuck and the superstrate or the template to cure the formable material, wherein an intensity variation of the light transmitting through the land and an area of the chuck adjacent to the land is reduced by the rounded edge of the land.

* * * * *